(12) United States Patent
Ernest et al.

(10) Patent No.: US 8,537,023 B2
(45) Date of Patent: Sep. 17, 2013

(54) METHOD AND APPARATUS PERTAINING TO AUTOMATIC ELECTRICAL-FAULT DETECTION

(75) Inventors: Joseph Christian Ernest, Woodstock, IL (US); Sean Edward Callahan, Elmhurst, IL (US); Edward Wayted Chen, Chicago, IL (US); Thomas Martin Kopera, Villa Park, IL (US); Timothy Edward Canzano, Glen Ellyn, IL (US)

(73) Assignee: iLight Technologies, Inc., Chicago, IL (US)

( * ) Notice: Subject to any disclaimer, the term of this patent is extended or adjusted under 35 U.S.C. 154(b) by 321 days.

(21) Appl. No.: 13/116,438

(22) Filed: May 26, 2011

(65) Prior Publication Data

US 2012/0299740 A1    Nov. 29, 2012

(51) Int. Cl.
  *G08B 21/00* (2006.01)
  *G01R 31/14* (2006.01)

(52) U.S. Cl.
  USPC ............................ 340/650; 340/649; 340/635

(58) Field of Classification Search
  USPC ................ 340/635, 649, 650, 652, 657, 660; 315/82, 129, 294, 299, 308; 322/20, 44; 324/509; 361/94, 98
  See application file for complete search history.

(56) References Cited

U.S. PATENT DOCUMENTS

| | | | |
|---|---|---|---|
| 4,161,761 A * | 7/1979 | Moran | ............................. 361/94 |
| 4,931,742 A | 6/1990 | Karash et al. | |
| 5,359,291 A | 10/1994 | Dommerich, III | |
| 6,366,208 B1 | 4/2002 | Hopkins et al. | |
| 6,807,035 B1 | 10/2004 | Baldwin et al. | |
| 7,016,171 B2 | 3/2006 | Bax et al. | |
| 7,129,652 B2 | 10/2006 | Patel et al. | |
| 7,248,451 B2 | 7/2007 | Bax et al. | |
| 7,327,051 B2 | 2/2008 | Ito et al. | |
| 7,550,934 B1 | 6/2009 | Deng et al. | |
| 7,606,679 B1 | 10/2009 | Voicu et al. | |
| 7,710,253 B1 | 5/2010 | Fredricks | |
| 7,751,161 B2 | 7/2010 | Williams | |
| 7,751,993 B2 | 7/2010 | Mirafzal | |
| 8,450,983 B2 * | 5/2013 | Gokan et al. | ..................... 322/20 |
| 2007/0086126 A1 | 4/2007 | Baxter | |
| 2010/0060170 A1 | 3/2010 | Nair | |
| 2011/0193481 A1 * | 8/2011 | Nakamura | ....................... 315/82 |

OTHER PUBLICATIONS

PCT Patent Application No. PCT/US2012/038372; International Search Report and Written Opinion Dated: Nov. 20, 2012.

* cited by examiner

*Primary Examiner* — Van T. Trieu
(74) *Attorney, Agent, or Firm* — Fitch, Even, Tabin & Flannery LLP

(57) ABSTRACT

An automatic fault detector momentarily interrupts a provision of operating power to a load having a minimal forward-bias voltage requirement to thereby provide a testing window and then applies a test voltage during this window that is less than the minimal forward-bias voltage requirement to the load and monitors for a power-to-ground fault. By one approach the aforementioned momentarily interruption of power is neither frequent enough nor long enough in duration to substantially impair the provision of power to the load. Accordingly, load performance is not noticeably diminished. One can then responsively prohibit subsequent provision of the operating power to the load. One can then continue to monitor for the power-to-ground fault while continuing to prohibit provision of operating power to the load. If and when the fault disappears, these teachings will then accommodate automatically resuming an ordinary provision of power to the load.

26 Claims, 4 Drawing Sheets

METHOD AND APPARATUS PERTAINING TO AUTOMATIC ELECTRICAL-FAULT DETECTION

TECHNICAL FIELD

This invention relates generally to the detection of electrical faults and more particularly to the detection of power-to-ground faults.

BACKGROUND

Electrical components require electrical power to operate and power supplies of one kind or another typically serve in those regards. Unfortunately electrical faults of various kinds can and do occur from time to time that interrupt the provision of this electrical power or that otherwise present operational difficulties and concerns. As one exemplary concern in these regards, the power supply itself may be damaged when such a fault occurs.

Some power supplies employ output protection that serve to protect the power supply when the power supply output feeds a low-impedance fault. This can comprise, for example, continuing to supply a maximum rated output current but at a reduced output voltage when a low-impedance fault occurs on, for example, a printed circuit board that represents the load. Unfortunately, while such an approach will typically succeed in protecting the power supply, the load itself may experience damage.

Furthermore, such an approach will often not succeed in detecting a high-impedance fault. Such a circumstance can also lead to a build-up of unwanted heat. This heat, of course, typically represents wasted energy and reduces the efficiency of the overall electrical system. Such heat, in turn, can also cause the resistance of the fault to decrease and hence create even more heat in an unwanted cycle sometimes referred to as thermal runaway.

BRIEF DESCRIPTION OF THE DRAWINGS

The above needs are at least partially met through provision of the method and apparatus pertaining to automatic electrical-fault detection described in the following detailed description, particularly when studied in conjunction with the drawings, wherein.

Figure 1:
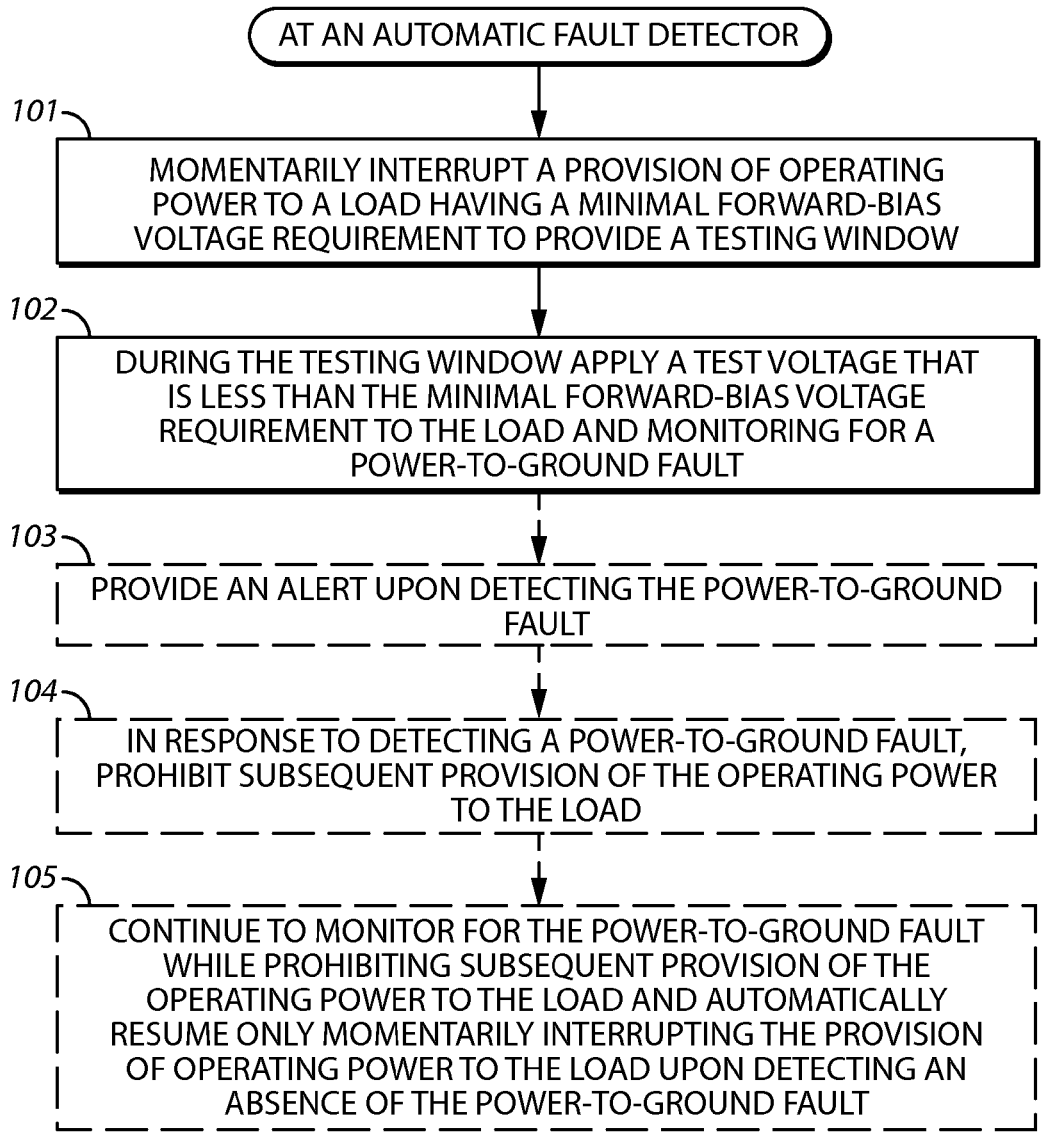
FIG. 1 comprises a flow diagram as configured in accordance with various embodiments of the invention.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

Generally speaking, pursuant to these various embodiments an automatic fault detector is configured to momentarily interrupt a provision of operating power to a load having a minimal forward-bias voltage requirement to thereby provide a testing window. The automatic fault detector then applies a test voltage during this testing window that is less than the minimal forward-bias voltage requirement to the load and monitors for a power-to-ground fault. By selecting appropriate values in these regards this approach, for example, can readily detect high-impedance power-to-ground faults.

By one approach the aforementioned momentary interruption of power is neither frequent enough nor long enough in duration to substantially impair the provision of power to the load. Accordingly, load performance is not noticeably diminished.

Upon detecting such a fault one can, if desired, then responsively prohibit subsequent provision of the operating power to the load. In this case, and again if desired, one can then continue to monitor for the power-to-ground fault while continuing to prohibit provision of operating power to the load. If and when the fault disappears, these teachings will then accommodate automatically resuming an ordinary provision of power to the load (which can include the aforementioned momentary interruption of that delivery of power in order to facilitate detecting a subsequent fault in the manner described).

So configured, a power supply and its load can be protected from a variety of faults including but not limited to high-impedance power-to-ground faults. These teachings will also permit automatic recovery from protections so taken when and if the fault is resolved. These teachings can be readily employed, if desired, with numerous existing circuits and hence can serve to leverage the useful life and service application possibilities of many previously-fielded platforms. These teachings are also highly scalable and can readily serve in a wide variety of application settings over a considerable range of operating voltages and currents and with any number of power supply configurations and technologies.

These and other benefits may become clearer upon making a thorough review and study of the following detailed description. Referring now to the drawings, and in particular to FIG. 1, an illustrative process 100 that is compatible with many of these teachings will now be presented. For the purposes of these illustrative examples it will be presumed that an appropriately configured automatic fault detector carries out the described steps.

At step 101 the automatic fault detector momentarily interrupts a provision of operating power to a load to provide a corresponding temporal testing window. For the sake of this illustrative example it will be presumed that this load has a minimal forward-bias voltage requirement. As one illustrative, non-limiting example in these regards, if the load comprises six serially-connected light-emitting diodes that each require at least 2.4 VDC to operate, the load will have a minimal forward-bias voltage requirement of about 14.4 VDC.

By one approach this momentary interruption of operating power is for only a brief enough period of time, and only so frequent, that the provision of operating power to the load is not substantially impaired. This reference to non-substantial impairment will be understood to refer to a range of altered load performance that does not noticeably and perceptibly deviate from an expected level of performance. By way of illustration, when the load comprises a plurality of light-emitting diodes, the referred-to momentary interruption of operating power is brief enough, and infrequent enough, that the average adult human observer will not discern a dimming effect with respect to the illumination provided by those light-emitting diodes.

For the sake of illustration and without intending any particular limitations in these regards this might comprise interrupting the provision of power no more frequently than about every 200 milliseconds and for a period of time of no more than about 5 consecutive milliseconds (such as, for example, 2 consecutive milliseconds). Other values in these regards can of course be considered depending upon the specifics of a given application setting.

At step 102 the automatic fault detector then applies a test voltage to the load during the aforementioned testing window. By one approach this test voltage is less than the aforementioned minimal forward-bias voltage requirement. By way of a non-limiting illustration, and again presuming the 14.4 VDC minimal forward-bias voltage requirement as corresponds to a load of six serially-connected light-emitting diodes, this test voltage could comprise, say, 5 VDC.

The automatic fault detector then monitors for a power-to-ground fault as corresponds to this delivery of the test voltage to the load. (As used herein this reference to "ground" will be understood to include true ground as well as other virtual or system lower-potential grounds. Such practices are well known in the art and require no further elaboration here.) By one approach, these teachings can be particularly applied to detect, at the least, high-impedance power-to-ground faults as well as low-impedance faults (such as a complete short circuit).

Figure 2:
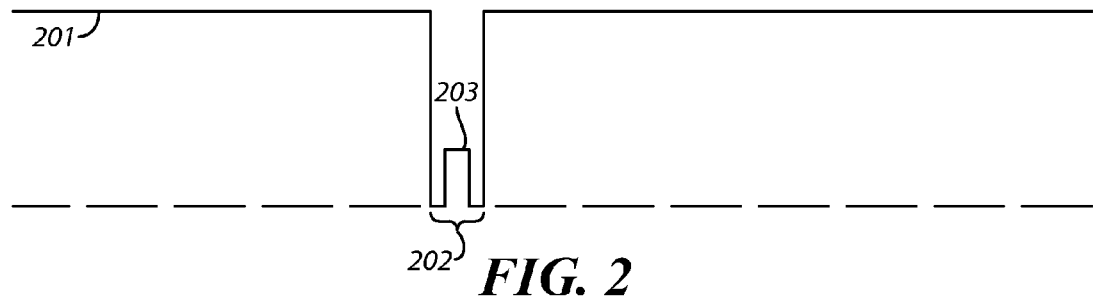
FIG. 2 comprises a timing diagram as configured in accordance with various embodiments of the invention.

These teachings will accommodate a variety of approaches in these regards. FIG. 2, for example, depicts operating power having an essentially constant voltage level 201 (that at least equals, for example, the aforementioned minimal forward-bias voltage requirement). In such a case the momentary interruption 202 can comprise 2 consecutive milliseconds that occurs no more frequently than, say, once every 200 milliseconds or so. During this temporal interruption 202, the aforementioned test voltage 203 is applied using a voltage amplitude that is less than that minimal forward-bias voltage requirement of the load.

As shown, this test voltage 203 can have a shorter duration than the momentary interruption 202. These teachings will accommodate other practices in these regards, however. For example, by one approach, the application of the test voltage 203 can be coextensive with the duration of the momentary interruption 202. As another example, this momentary interruption 202 could accommodate two or more discrete test-voltage pulses if desired.

In the case of employing a plurality of test-voltage pulses in a single test window the various test-voltage pulses can each have the same amplitude or can, if desired, have different voltages (and/or durations). Similarly, the test-voltage pulses from one testing window 202 to another can have matching, or differing, amplitudes and/or durations as desired.

Figure 3:
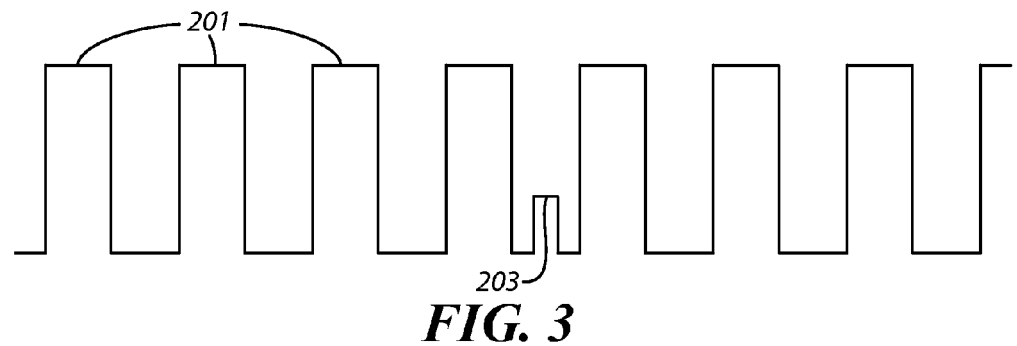
FIG. 3 comprises a timing diagram as configured in accordance with various embodiments of the invention.

In the illustrative example just provided the operating power 201 had a relatively constant amplitude (aside from the testing windows). These teachings can be applied in other application settings, however. For example, this process 100 can be applied in conjunction with a pulse-width modulation-type power supply that supplies constant-amplitude pulses that exhibit a particular selected duty cycle. For example, FIG. 3 illustrates such a series of operating-power pulses at a 50% duty cycle. In such a case, by one approach, the aforementioned momentary interruption can be combined with a time when the operating power is otherwise in a null as shown. Using this approach, the test voltage 203 can be applied in-between the ordinary operating-power pulses and hence the testing can be done with no effect whatsoever on the performance of the load device.

As a related example, the power-interruption capability of these teachings can itself be leveraged, if desired, to itself serve additional purposes that are akin to an ordinary pulse-width modulation-type power supply. This could comprise, for example, specifically varying the duration and frequency of the testing window in response to an appropriate input (such as a controlling analog voltage, digital input, or the like) to thereby modify the average power output to the load. This could permit, for example, controlled dimming of a load comprised of light-emitting diodes.

In any event, and returning again to FIG. 1, this process 100 will then accommodate any of a variety of follow-on activities. As one example in these regards, at optional step 103 the automatic fault detector can provide an alert (such as an audible alert, a visual alert (such as an illuminated light, a blinking light, an illuminated word, an automatically-transmitted email, short message service message, or Tweet, or the like), a haptic alert, or any other useful signal or combination of the foregoing as desired). The purpose of this alert can be to ultimately notify one or more authorized or responsible persons or response systems of the fault condition to thereby prompt and facilitate a corresponding mitigating or corrective action.

Such an alert can be provided for as long as may be wished. This might comprise a relatively short period of time or provision of the alert may persist essentially indefinitely until, for example, an authorized person terminates the alert and/or the automatic fault detector detects mediation of the fault.

As another example of a follow-on activity, at optional step 104 the automatic fault detector, in response to detecting the power-to-ground fault, can prohibit subsequent provision of the operating power to the load. By one approach this can comprise responding in this manner to any detected fault. By another approach, however, this step will accommodate only taking this action when, for example, at least a predetermined number of intermittent faults are detected within some relevant window of time and/or the detected fault persists for at least some predetermined period of time.

If desired, when terminating power in this way, one may require an authorized person to manually intervene and, for example, reset the system in order to again permit the provision of operating power to the load. By another approach, however, either in lieu of the foregoing or in combination therewith, this process 100 will accommodate the optional step 105 of continuing to monitor for the detected power-to-ground fault while prohibiting subsequent provision of operating power to the load and then automatically resuming the ordinary provision of operating power upon detecting an absence of the power-to-ground fault. This can comprise, for example, basing this automated response upon detecting that the power-to-ground fault has been absent for at least a predetermined amount of time such as 1 second, 5 seconds, 1 minute, or some other duration of choice.

When automatically resuming the provision of operating power to the load, this step 105 can further comprise resuming the aforementioned occasional fault testing. By one approach this can comprise using the same fault testing protocol as had been employed prior to detecting the fault. By another approach, however, this fault testing protocol can be changed when recovering from a detected fault. By way of illustration and without intending any particular limitations in these regards, when five brief, intermittent faults are ordinarily required to prompt the above-described response, the post-fault fault detecting protocol might require instead only, say, three such intermittent faults before again taking an appropriate responsive action. This greater degree of sensitivity might persist, for example, for some duration of time (such as an hour or a day) before the automatic fault detector again utilizes an ordinary fault testing protocol.

Figure 4:
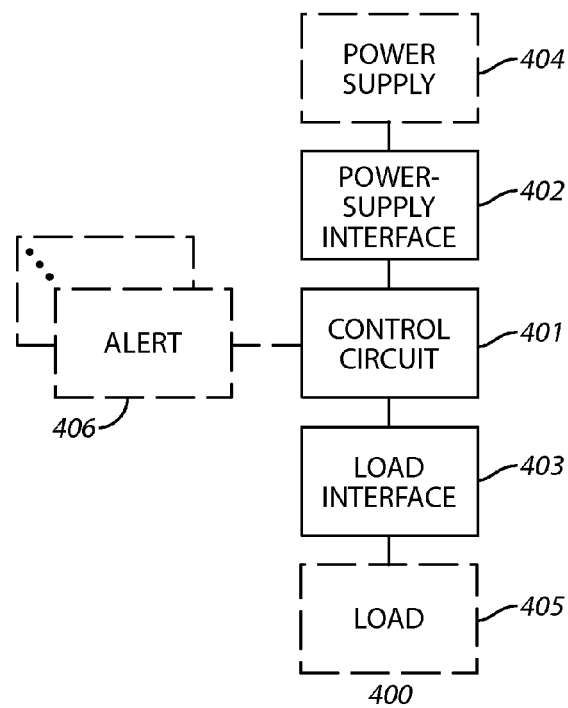
FIG. 4 comprises a block diagram as configured in accordance with various embodiments of the invention.

The above-described processes are readily enabled using any of a wide variety of available and/or readily configured platforms, including partially or wholly programmable platforms as are known in the art or dedicated purpose platforms as may be desired for some applications. Referring now to FIG. 4, an illustrative approach to such an automatic fault detector 400 will now be provided.

This illustrative automatic fault detector 400 generally comprises a control circuit 401 that operably couples to a power-supply interface 402 and a load interface 403. Such a control circuit 401 can comprise a fixed-purpose hard-wired platform or can comprise a partially or wholly programmable platform. All of these architectural options are well known and understood in the art and require no further description here.

The aforementioned power-supply interface 402 can operably couple to one or more power supplies 404 (such as, but certainly not limited to, a pulse-width modulation-type power supply) of choice. The load interface 403, in turn, can operably couple to one or more loads 405 having a corresponding minimal forward-bias voltage requirement (such as, but certainly not limited to, a serially-connected plurality of light-emitting diodes).

If desired, the control circuit 401 can also operably couple to one or more alert components 406 to facilitate, for example, the provision of the previously-described visual and/or audible alerts.

Such a control circuit 401 can be configured (via, for example, corresponding programming when the control circuit 401 comprises a partially or wholly-programmable platform) to carry out one or more of the steps, actions, and/or functions described herein. This can include, for example, configuring the control circuit 401 to provide a testing window by momentarily interrupting a provision of operating power from the power supply 404 to the load 405 and then, during that testing window, applying a test voltage to the load 405 that is less than the minimal forward-bias voltage requirement and monitoring for a power-to-ground fault.

Such an apparatus 400 may be comprised of a plurality of physically distinct elements as is suggested by the illustration shown in FIG. 4. It is also possible, however, to view this illustration as comprising a logical view, in which case one or more of these elements can be enabled and realized via a shared platform. It will also be understood that such a shared platform may comprise a wholly or at least partially programmable platform as are known in the art. It will also be understood that such a fault detector can comprise a discrete component that is physically separate from, for example, the power supply or, if desired, the fault detector can comprise an integral part of the power supply.

For the sake of illustration a more specific example in these regards will now be provided. It will be understood that no particular limitations are intended to be implied by the specificity of this example.

Figure 5:
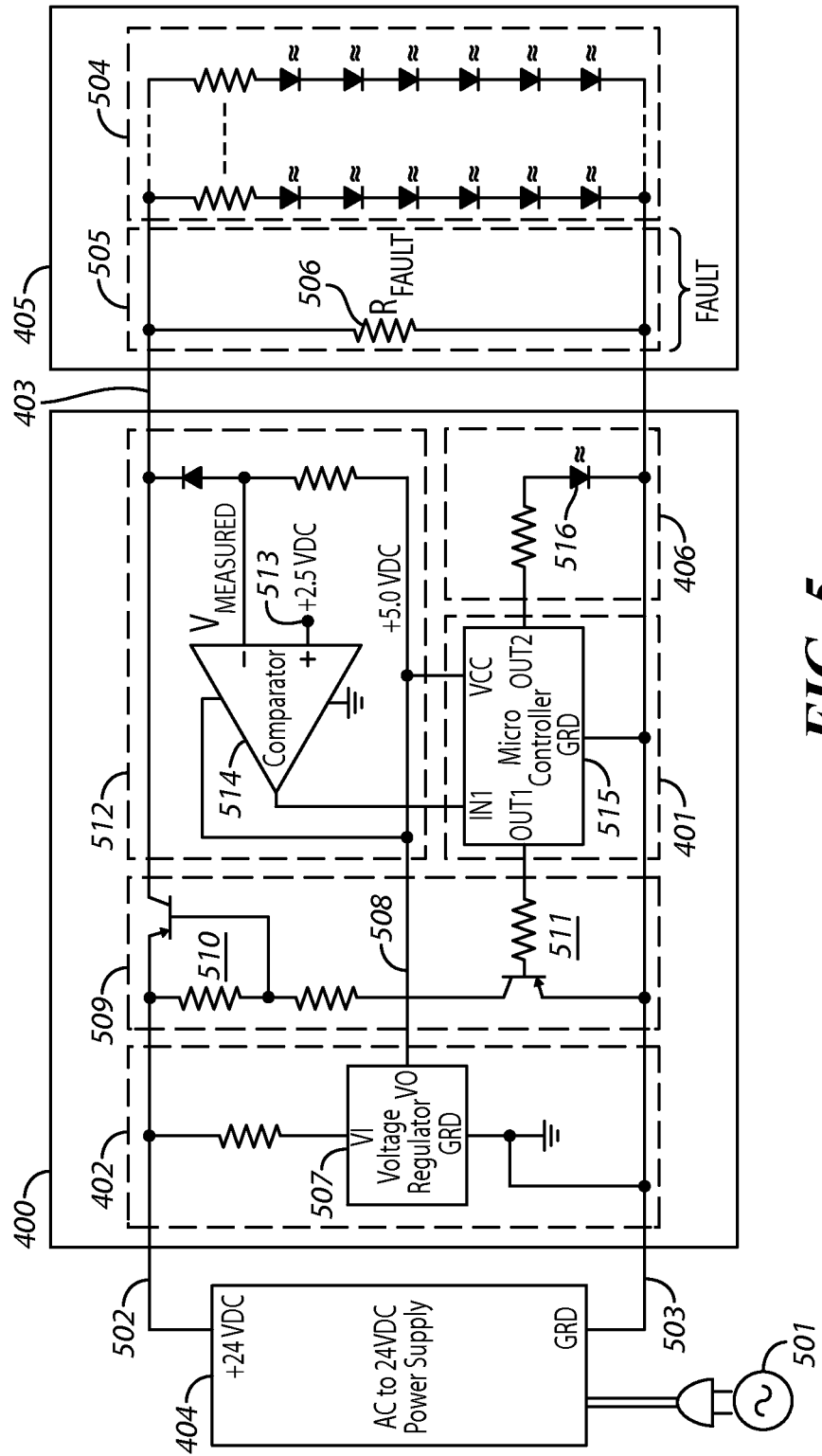
FIG. 5 comprises a schematic diagram as configured in accordance with various embodiments of the invention.

Referring now to FIG. 5, an illustrative automatic fault detector 400 operably couples between a power supply 404 and a corresponding load 405. In this example the power supply 404 comprises a 120 VAC to 24 VDC power supply that connects to an electrical mains 501 of choice and that provides a +24 VDC line 502 and a ground line 503. The load 405, in turn, comprises a plurality of series-connected light-emitting diodes 504 and, for the sake of illustration, a power-to-ground fault 505 having a corresponding high impedance represented here by $R_{FAULT}$ 506.

The detectable range of the high-impedance fault can be chosen as a function, at least in part, of the design of the particular implementation. By one approach this range can be chosen based on the impact of that fault on the performance of the load device. For example, if decreased system efficiency is of primary concern then the detectable threshold may be set relatively low. Presuming an ordinary supply of 24VDC an $R_{FAULT}$ of 100Kohms may only result in an increased power consumption of 5.76 mW in a given application setting while an $R_{FAULT}$ of 100 ohms results in a power consumption of 5.76 W. Alternatively, if internal heat generation is of primary concern then an $R_{FAULT}$ of 10 Kohms would result in a power dissipation of 50.76 mW which, depending on the dissipating material, can result in a significant amount of heat.

In addition, the low end of a high-impedance short may also prompt power supply considerations regarding the current limit and internal protection circuitry. For example, a load pulling 4A at 24V is equivalent to a 6 ohm resistive load.

The power-supply interface 402 in this illustrative example includes a voltage regulator 507 that provides +5 V DC 508 to appropriately power and/or operationally bias various components of the automatic fault detector 400.

The automatic fault detector 400 also includes a switch circuit 509 and a test circuit 512. The switch circuit 509 comprises a first transistor circuit 510 that can control the provision of operating power from the power supply 404 to the load 405 and a second transistor circuit 511 that can control the on and off state of that first transistor circuit 510. The test circuit 512, in turn, serves to both provide a low-level test voltage to the load 405 when the switch circuit 509 denies operating power to the load 405 and to compare the response of the load 405 to that low-level test voltage against a test threshold (here, +2.5 V DC 513) using a comparator 514.

A microcontroller 515 as comprises the control circuit 401 operably couples to respond to the output of the aforementioned comparator 514 and to control the aforementioned switch circuit 509 to thereby control the provision of operating power to the load 405 from the power supply 404. In this illustrative embodiment the microcontroller 515 also operably couples to an alert component 406 comprising a light-emitting diode 516.

Figure 6:
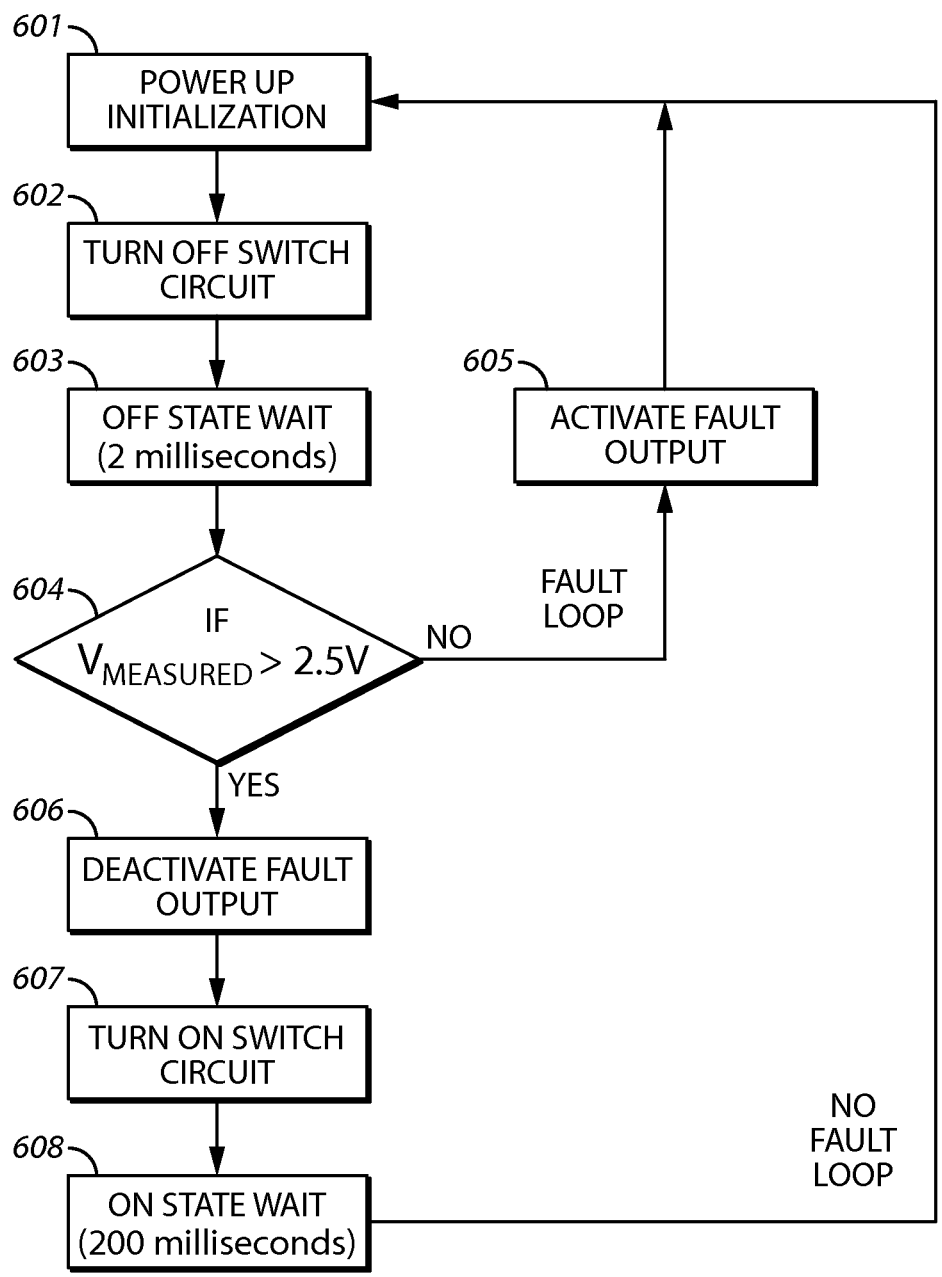
FIG. 6 comprises a flow diagram as configured in accordance with various embodiments of the invention.

FIG. 6 represents one illustrative approach to programming this microcontroller 515. Upon initializing 601, this programming 600 then, at step 602, turns off the aforementioned switching circuit 509 to thereby momentarily interrupt the provision of operating power to the load 405. After waiting (and/or during) about 2 milliseconds pursuant to step 603, the microcontroller 515 then assesses at step 604 whether the measured voltage $V_{MEASURED}$ is greater than the test threshold of 2.5 volts. A false response reflects the presence of a fault and the microcontroller 515 enters a fault loop pursuant to which the microcontroller 515 utilizes the switch circuit 509 to activate a fault output response at step 605.

In the absence of a detected fault, the microcontroller 515 deactivates any previously imposed fault output at step 606 and then utilizes the switch circuit 509 to return operating power to the load 405 pursuant to step 607. The microcontroller 515 then, at step 608, waits for 200 milliseconds and repeats the foregoing steps to repeatedly test for a detected fault.

The described teachings and embodiments can be readily employed in a wide variety of application settings and often for only a minimal incremental expense. These teachings are also easily scaled to accommodate a variety of operating power ranges, test-voltage levels, and testing window ranges.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

As one example in these regards, the testing window can be provided only when first powering up the power supply. For example, upon switching on the power supply, but before actually permitting power to be supplied to the load, the test voltage can be applied as described above. So configured, these teachings will provide for momentarily delaying the provision of initial operating power to the load to provide the testing window. Presuming the absence of a detected fault, the ordinary supply of power to the load can then proceed (with or without further interruption as desired).

As yet another example in these regards, the previously-described procedures can follow such an initial testing window if desired.

We claim:

1. A method comprising:
    at an automatic fault detector:
        momentarily interrupting a provision of operating power to a load having a minimal forward-bias voltage requirement to provide a testing window;
        during the testing window applying a test voltage that is less than the minimal forward-bias voltage requirement to the load and monitoring for a power-to-ground fault.

2. The method of claim 1 wherein momentarily interrupting the provision of power comprises interrupting the provision of power for only a brief enough period of time that the provision of operating power to the load is not impaired.

3. The method of claim 2 wherein the period of time is no more than 5 consecutive milliseconds.

4. The method of claim 1 wherein momentarily interrupting the provision of power comprises not so interrupting the provision of power frequently enough that the provision of operating power to the load is impaired.

5. The method of claim 4 wherein not so interrupting the provision of power frequently enough that the provision of operating power to the load is impaired comprises not so interrupting the provision of power any more frequently than about every 200 milliseconds.

6. The method of claim 1 wherein the load comprises a serially-connected plurality of light-emitting diodes.

7. The method of claim 1 wherein the power-to-ground fault comprises a high-impedance power-to-ground fault.

8. The method of claim 1 further comprising:
    in response to detecting a power-to-ground fault, prohibiting subsequent provision of the operating power to the load.

9. The method of claim 8 further comprising:
    continuing to monitor for the power-to-ground fault while prohibiting subsequent provision of the operating power to the load and automatically resuming only momentarily interrupting the provision of operating power to the load upon detecting an absence of the power-to-ground fault.

10. The method of claim 9 wherein detecting an absence of the power-to-ground fault comprises detecting the absence of the power-to-ground fault for at least a predetermined amount of time.

11. The method of claim 1 further comprising:
    providing an alert upon detecting the power-to-ground fault.

12. The method of claim 11 wherein the alert comprises a visual alert.

13. The method of claim 1 wherein momentarily interrupting a provision of operating power to a load having a minimal forward-bias voltage requirement to provide a testing window comprises momentarily delaying a provision of initial operating power to the load to provide the testing window.

14. An apparatus comprising:
    a power-supply interface;
    a load interface;
    a control circuit operably coupled to the power-supply interface and the load interface and configured to:
        provide a testing window by momentarily interrupting a provision of operating power from a power supply that is coupled to the power-supply interface to a load that is coupled to the load interface and that has a minimal forward-bias voltage requirement;
        during the testing window apply a test voltage that is less than the minimal forward-bias voltage requirement to the load and monitor for a power-to-ground fault.

15. The apparatus of claim 14 wherein the control circuit is configured to momentarily interrupt the provision of power by interrupting the provision of power for only a brief enough period of time that the provision of operating power to the load is not impaired.

16. The apparatus of claim 15 wherein the period of time is no more than 5 consecutive milliseconds.

17. The apparatus of claim 16 wherein the control circuit is configured to momentarily interrupt the provision of power infrequently and of short enough duration that the provision of operating power to the load is not impaired.

18. The apparatus of claim 17 wherein not so interrupting the provision of power frequently enough that the provision of operating power to the load is impaired comprises not so interrupting the provision of power any more frequently than every 200 milliseconds.

19. The apparatus of claim 14 wherein the load comprises a serially-connected plurality of light-emitting diodes.

20. The apparatus of claim 14 wherein the power-to-ground fault comprises a high-impedance power-to-ground fault.

21. The apparatus of claim 14 wherein the control circuit is further configured to, in response to detecting a power-to-ground fault, prohibit subsequent provision of the operating power to the load.

22. The apparatus of claim 14 wherein the control circuit is further configured to continue to:
    monitor for the power-to-ground fault while prohibiting subsequent provision of the operating power to the load; and
    automatically resume only momentarily interrupting the provision of operating power to the load upon detecting an absence of the power-to-ground fault.

23. The apparatus of claim 22 wherein the control circuit is configured to detect an absence of the power-to-ground fault by detecting the absence of the power-to-ground fault for at least a predetermined amount of time.

24. The apparatus of claim 14 wherein the control circuit is further configured to provide an alert upon detecting the power-to-ground fault.

25. The apparatus of claim 24 wherein the alert comprises a visual alert.

26. The apparatus of claim 14 wherein the power-supply interface comprises an interface to a pulse-width modulation-type power supply.

* * * * *